United States Patent [19]

Takai

[11] Patent Number: 5,672,970

[45] Date of Patent: Sep. 30, 1997

[54] MAGNETIC-RESONANCE IMAGING APPARATUS

[75] Inventor: Hiroshi Takai, Tochigi-ken, Japan

[73] Assignee: Kabushiki Kaisha Toshiba, Kawasaki, Japan

[21] Appl. No.: 771,002

[22] Filed: Dec. 23, 1996

Related U.S. Application Data

[63] Continuation of Ser. No. 294,106, Aug. 22, 1994, abandoned.

[30] Foreign Application Priority Data

Aug. 30, 1993 [JP] Japan ..................... 5-213886

[51] Int. Cl.$^6$ .................. G01V 3/00; G01V 3/14
[52] U.S. Cl. ........................... 324/309; 324/307
[58] Field of Search .......................... 324/306, 307, 324/309

[56] References Cited

U.S. PATENT DOCUMENTS 5,229,717  7/1993  Hinks ..................... 324/309
5,270,654  12/1993  Feinberg et al. .

FOREIGN PATENT DOCUMENTS 62-227337  10/1987  Japan.

OTHER PUBLICATIONS

"Two Contrast RARE:A Fast Spin-Density and T2-Weighted Imaging Method" Higuchi et al; JMRI 1991 Annual Meeting; p. 147.

Primary Examiner—Sandra L. O'Shea
Assistant Examiner—Mack Haynes
Attorney, Agent, or Firm—Limbach & Limbach LLP; Ronald L. Yin

[57] ABSTRACT

A magnetic-resonance imaging apparatus of the present invention performs a field echo sequence and high-speed spin echo sequence with an excitation pulse shared by them and, by so doing, it is possible to, in comparison with the high-speed spin echo sequence only, reduce a repetition time and hence an imaging time.

10 Claims, 6 Drawing Sheets

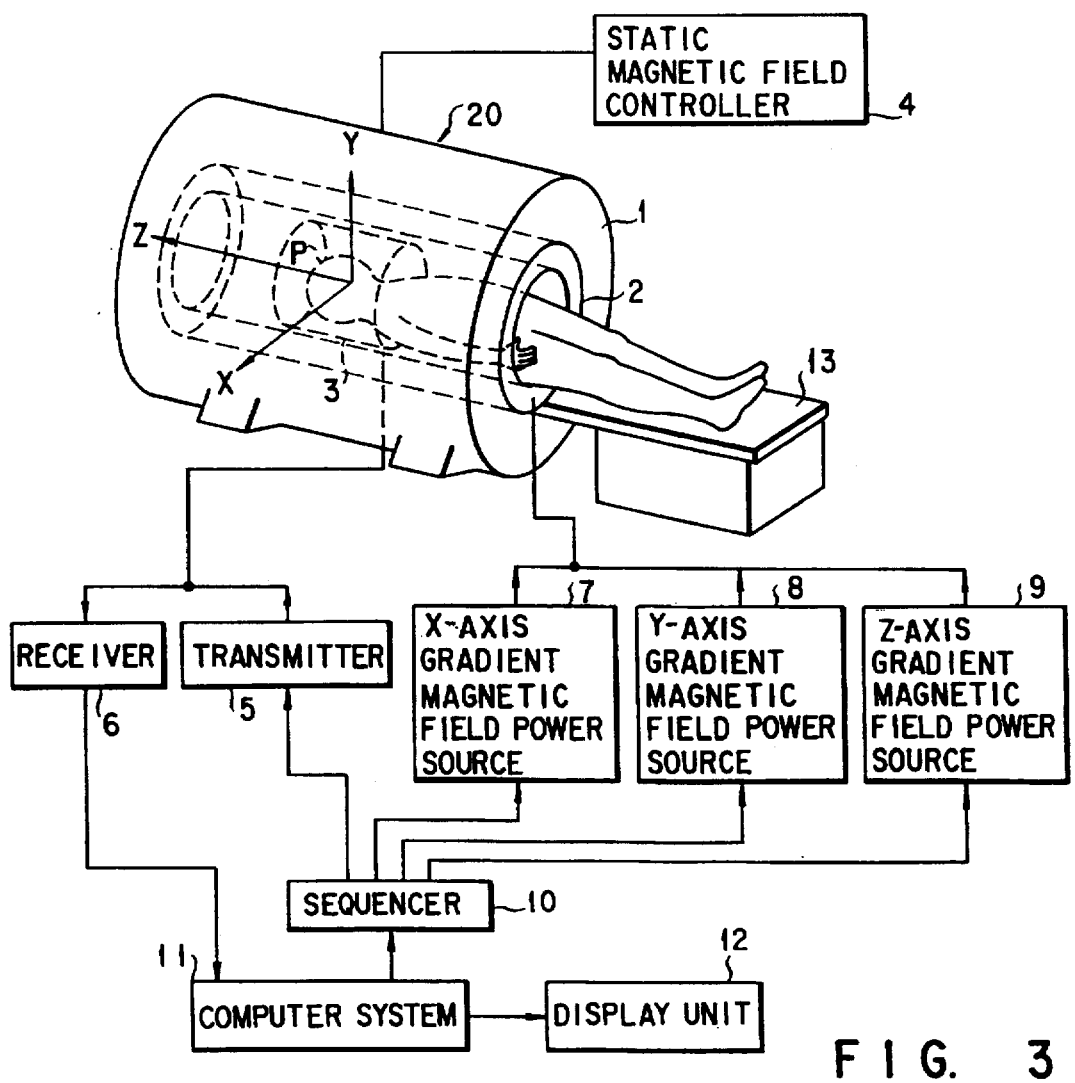
F I G. 3

MAGNETIC-RESONANCE IMAGING APPARATUS

This is a continuation of application Ser. No. 08/294,106 filed on Aug. 22,1994, abandoned.

Background of the Invention

1. Field of the Invention

The present invention relates to a magnetic-resonance imaging apparatus using a double contrast mode imaging method for obtaining a spin density image and $T_2$-enhanced image with the use of echoes obtained through a sequence of pulses.

2. Description of the Related Art

A so-called high-speed spin echo method (hereinafter referred to simply as a high-speed SE method) is known as an imaging method in the field of a magnetic-resonance imaging. The pulse sequence as used in the high-speed SE method is shown in FIG. 1. In an ordinary spin echo method, one echo is obtained from a 90° pulse-τ-180° pulse sequence and, in order to obtain all data required for an image composition, it has been necessary to repeat such a pulse sequence. In the high-speed SE method, after the supply of a 90° pulse, a 180° pulse is repetitively supplied for each time lapse of τ, 3τ, 5τ, 7τ..., and, by so doing, it is possible to repetitively obtain a first, a second, a third, ..., echo at a respective echo time TE (a time from the supply of a 90° pulse to the detection of its echo) of 2τ, 4τ, 6τ, 8τ, .... In the high-speed SE method, all the data necessary to the construction of an image can be obtained at a shorter imaging time than in the ordinary spin echo method.

As shown in FIG. 2, in the double contrast mode, it is possible to obtain a spin density distribution, that is, a spin density image (PD), from a former half of echoes, say, first to third echoes, and a transverse relaxation time $T_2$-enhanced image as a $T_2$-enhanced image ($T_2W$) from a latter half of echoes, say, fourth to sixth echoes.

The task of the magnetic-resonance imaging is to reduce the imaging time without degrading any contrast and S/N ratio. The same thing can also be said about a double contrast mode. One method for reducing the imaging time is to vary a repetition time TR showing a 90° pulse cycle. Since, however, the contrast of spin echoes is given as a function of an echo time TE and repetition time TR, a contrast involved will be degraded. The S/N ratio is also decreased due to the shorting of a read time. On the other hand, the imaging time can be reduced by decreasing the number of repetitions of a 90° pulse without varying the repetition time TR. In this case, however, an image resolution obtained will be lowered due to a decrease in the number of data collected.

In the double contrast mode, it has not been possible to reduce the imaging time, while suppressing the degrading of the contrast, S/N ratio and image resolution.

SUMMARY OF THE INVENTION

It is, accordingly, the object of the present invention to provide a magnetic-resonance imaging apparatus which can reduce an imaging time in a double contrast mode while suppressing a lowering of a contrast, S/N ratio and image resolution involved.

According to the present invention, there is provided a magnetic-resonance imaging apparatus comprising:

static magnetic field generating means for applying a static magnetic field;

transmitting/receiving means for applying an excitation pulse to a specific slice volume of a subject placed in the static magnetic field and for detecting a magnetic-resonance signal from the slice volume;

gradient magnetic field generating means for generating a slice gradient magnetic field, phase-encoding gradient magnetic field and read gradient magnetic field;

control means for controlling the transmitting/receiving means and gradient magnetic field generating means to perform a field echo sequence and high-speed spin echo sequence with the excitation pulse shared between these sequences; and image composing means for composing first and second images with the use of the magnetic-resonance signal detected by the transmitting/receiving means.

According to the present invention, since the field echo sequence and high-speed spin echo sequence are performed with the excitation pulse shared between them, it is possible to reduce, in comparison with the high-speed spin echo sequence only, the number of repetition times without degenerating the contrast, S/N ratio and image resolution and hence to reduce the imaging time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a block diagram showing an arrangement of a magnetic-resonance imaging apparatus according to an embodiment of the present invention;

DETAILED DESCRIPTION OF THE PREFERRED EMBODIMENT

Figure 1:
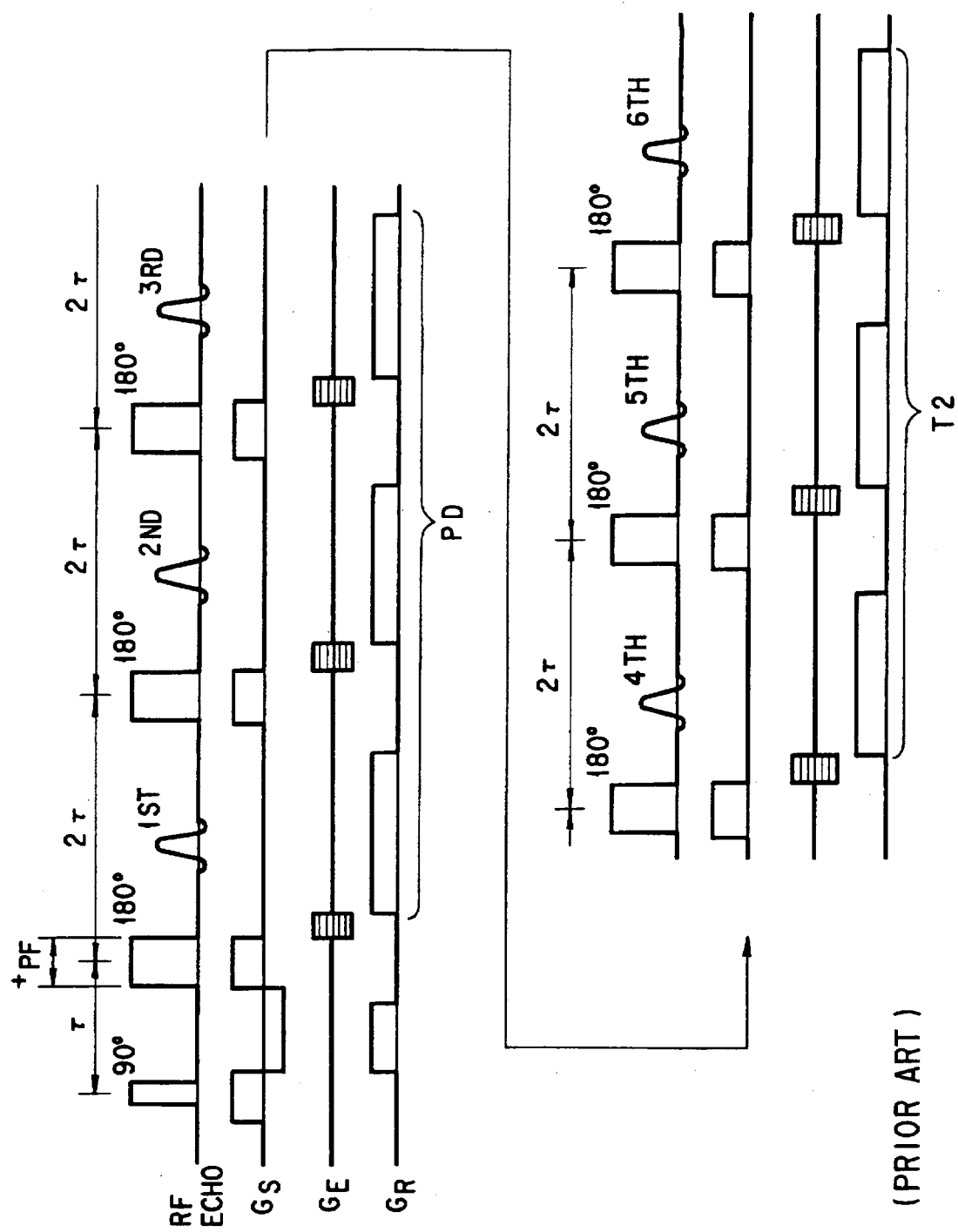
FIG. 1 is a time chart showing a pulse sequence of a conventional high-speed spin echo method.
Figure 2:
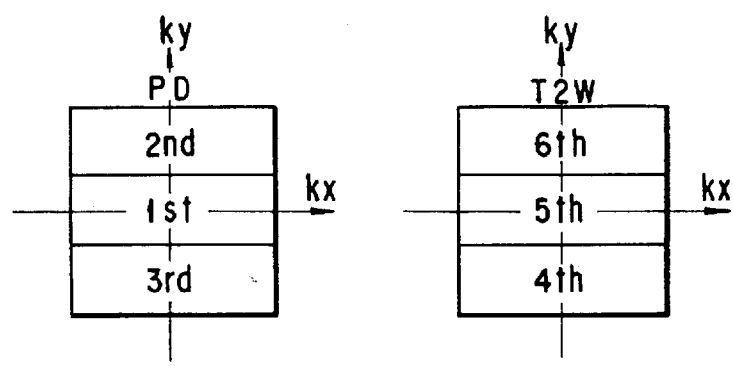
FIG. 2 is a view showing a method for allocating a plurality of echoes obtained in a pulse sequence of FIG. 1 to two kinds of images in a double contrast mode.

An embodiment of the present invention will be explained below with reference to the accompanying drawings.

FIG. 3 is a block diagram showing a magnetic-resonance imaging apparatus according to an embodiment of the present invention. A static field magnet 1 is held in a cylindrical gantry 20 to create a static magnetic field. Through the carrying of electric current through the static field magnet 1 under the static field controller 4 a static field is created in the cylinder along a Z direction. As the static field magnet 1 use may be made of a superconducting coil, normal conducting coil or permanent magnet. At a time of imaging, a subject P to be examined is placed in the cylinder through the utilization of a table 13.

A gradient magnetic field coil unit 2 is held in place in the gantry 20. The coil unit 2, not shown, includes an X-, a Y- and Z-axis gradient magnetic field coil. Through the carrying of electric current through the X-axis gradient magnetic field coil by an X-axis gradient magnetic field power source 7, an X-axis gradient magnetic field is generated with its magnetic field intensity oblique along the X-axis direction. Through the carrying of electric current through the Y-axis gradient magnetic field coil by a Y-axis gradient magnetic field power source 8, a Y-axis gradient magnetic field is created with its magnetic field intensity oblique along the Y-axis direction. Through the carrying of electric current through the Z-axis gradient magnetic field coil by a Z-axis gradient magnetic power source 9, a Z-axis gradient magnetic field is created with its magnetic field intensity oblique along the Z-axis direction. Normally, the Z-axis is set parallel to a body axis of the subject p and both the X-axis and the Y-axis orthogonal to the X-axis are set in a plane orthogonal to the Z-axis. The X-axis gradient magnetic field, Y-axis gradient magnetic field and Z-axis gradient magnetic field can be made to correspond to, selectively, a read gradient magnetic field GR, phase-encoding gradient magnetic field GE and slice gradient magnetic field GS, but, in this embodiment, are treated as corresponding to these fields GR, GE and GS, respectively.

A transmit/receive coil 3 is held in place in the gantry 20. Upon inducing a magnetic resonance the transmit/receive coil 3 is connected to a transmitter 5. AT this time, a frequency-adjusted pulse is applied from the transmitter 5 to the transmit/receive coil 3 to selectively excite a corresponding specified slice volume and a slice select excitation pulse (90° pulse) and inverted pulse (180° pulse) in a radio band are generated from the transmit/receive coil 3. At a time of detecting a magnetic-resonance signal, here, a spin echo, the transmit/receive coil 3 is connected to a receiver 6. The receiver 6 receives a magnetic-resonance signal (spin echo) induced in transmit/receive coil 3. Here, the signal transmit/receive coil 3 is used for excitation and reception but separate coils may be provided one for excitation and one for reception.

A computer system 11 detects, via the receiver 6, a magnetic-resonance signal induced in the transmit/receive coil 3 and composes first and second images in a double contrast mode. In a practical application, the first and second images correspond to a spin density image and $T_2$-enhanced image, respectively. These images are displayed on a display unit 12 and saved in a memory device, not shown.

A sequencer 10 controls the X-axis gradient magnetic field power source 7, Y-axis gradient magnetic field power source 8, z-axis gradient magnetic field power source 9, transmitter 5 and receiver 6 and performs a sequence unique to the present invention, that is, performs a field echo sequence and then a high-speed spin echo sequence with the excitation pulse shared between them.

Figure 4:
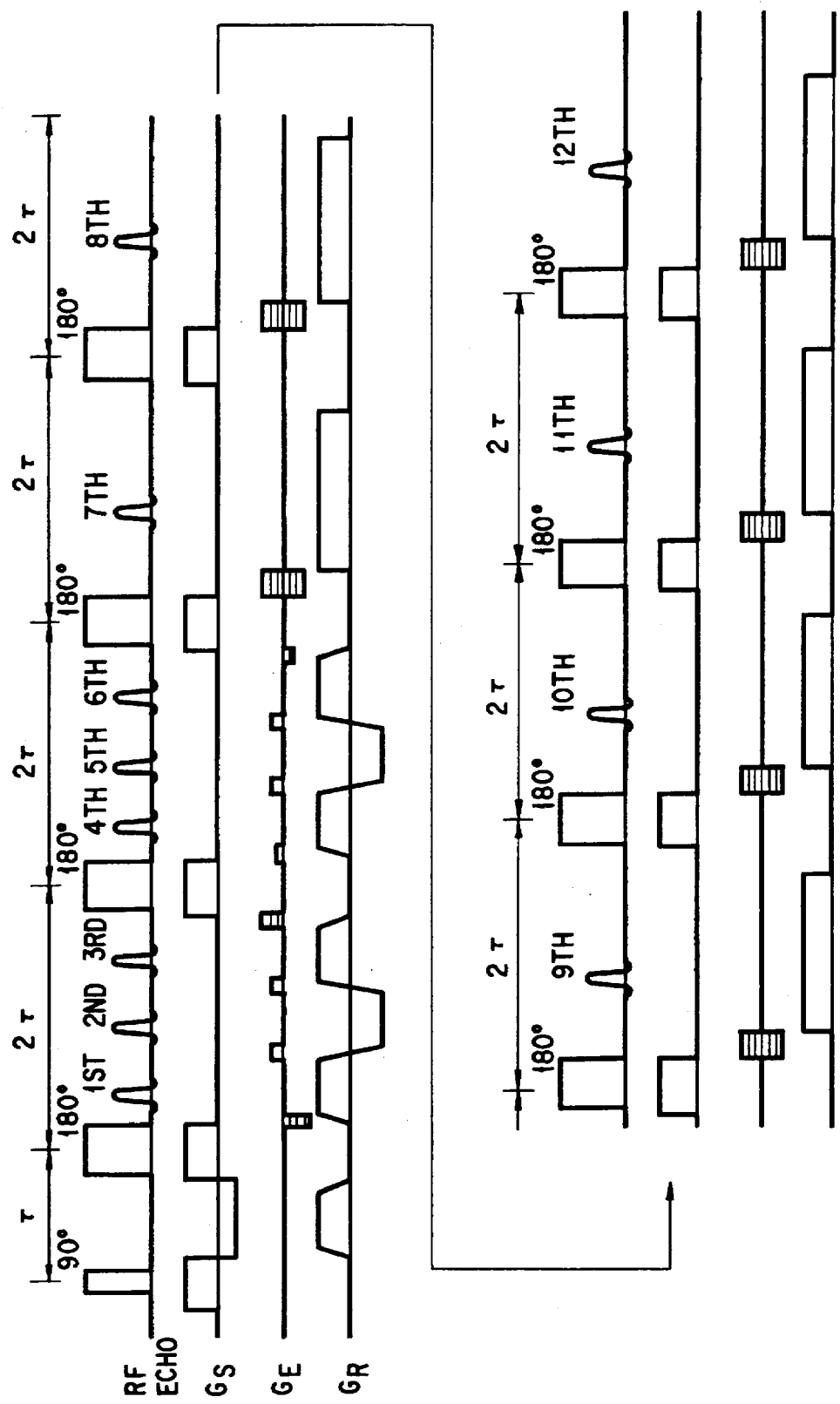
FIG. 4 is a time chart showing a pulse sequence for echo collection on the embodiment of the present invention.

The operation of the present embodiment will be explained below. FIG. 4 is a time chart showing a pulse sequence on the embodiment of the present invention. The pulse sequence is performed under control of the pulse sequencer 10. The feature of the present invention lies in that the field echo sequence is performed in a given interval of a high-speed spin echo sequence. The field echo sequence is also called as a gradient echo sequence, that is, a high-speed imaging technique which, after the excitation pulse, repetitively generates a magnetic-resonance signal of a varying echo time while subjecting the read gradient magnetic field GR to polarity inversion. Here, in order to obtain a spin echo, an inverted pulse (180° pulse) is applied after the excitation pulse and the read gradient magnetic field GR is subjected to polarity inversion after the inverted pulse. By the high-speed spin echo sequence is meant the high-speed imaging technique which, after an excitation pulse, repeats the divergence and convergence of spins, while repetitively applying inverted pulses at a given cycle of $2\tau(\tau=10$ msec for example), to repetitively generate a spin echo of a varying echo time.

First, a frequence-adjusted excitation pulse (90° pulse), together with a slice gradient magnetic field GS, is so applied as to selectively excite a given slice volume.

After the excitation pulse, a first inverted pulse is applied after the lapse of a $\tau$ time and then an inverted pulse is repetitively applied at a given interval $2\tau(\tau=10$ msec for example).

After previous-stage specific inverted pulses, here, the first and second inverted pulses, a field echo sequence is carried out. That is, after the first and second inverted pulses, a read gradient magnetic field GR is subjected to polarity inversion and, by so doing, a spin echo of a varying echo time is supplied, as a phase-encoded data, via the transmit/receive coil 3 to the receiver 6 where it is repetitively detected. Here, the read gradient magnetic field GR is twice inverted and, for each one inverted pulse, three spin echoes are detected. Those spin echoes repetitively obtained after the excitation pulse in a sequential order are called as a first, a second, a third echo, . . . .

After the completion of the field echo sequence, that is, the third and following inverted pulses, a high-speed spin echo sequence is carried out and, in this way, for respective inverted pulse, a seventh, an eighth, . . . , twelfth echo , . . . , are sequentially generated, as phase-encoded data, via the transmit/receive coil 3 to the receiver 6.

Such excitation pulses and sequential pulses are repeated at a repetition time TR cycle until those data items necessary to compose first and second images are obtained.

Figure 6A:
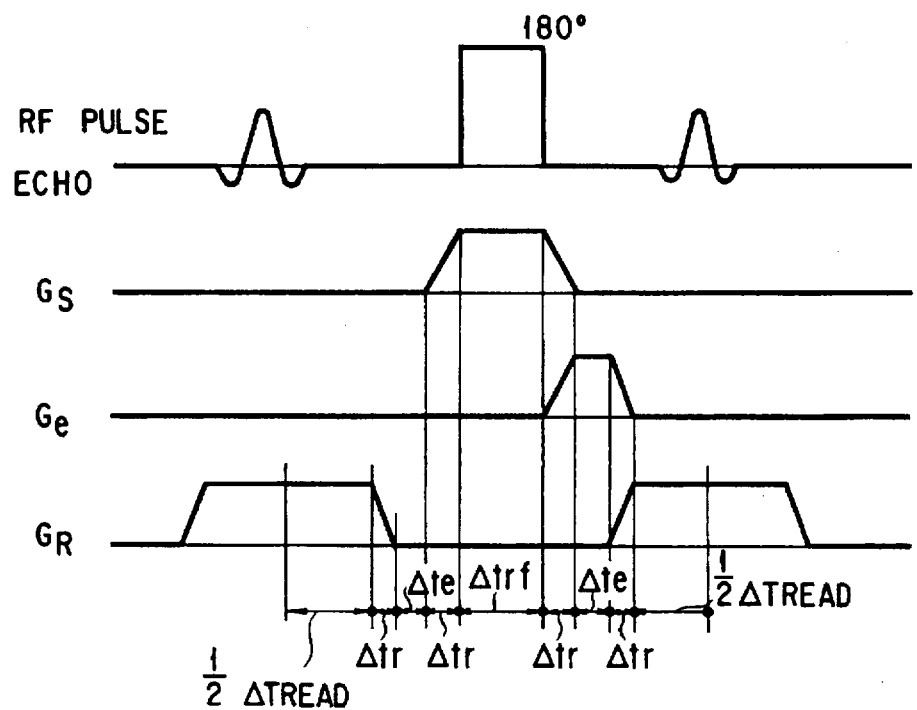
FIGS. 6A and 6B show the varying time intervals of temporally adjacent two echoes, using a high-speed spin echo method and field echo method, respectively.
Figure 6B:
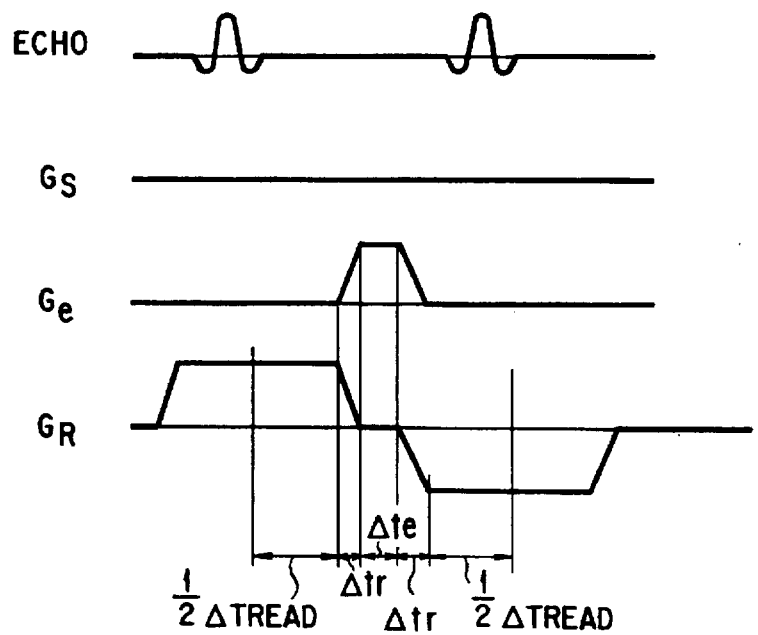

FIG. 6A shows a time interval of temporally adjacent two spin echoes in a high-speed spin echo sequence and FIG. 6B shows a time interval (echo interval) of temporally adjacent two spin echoes in the field echo sequence. In these Figures, $\Delta t_{rf}$ denotes a 180° pulse application time, $\Delta tr$ a time for a gradient magnetic field to rise and fall, $\Delta te$ an application time of a phase-encoded gradient magnetic field, and $\Delta t_{read}$ a read time of a spin echo, assuming that, for ease in understanding, these respective times are the same in the respective sequences.

In the high-speed spin echo sequence, the echo interval T is given by $$T = \Delta t_{read} + 2 \cdot \Delta te + \Delta trf + 4 \cdot \Delta tr$$

In the field echo sequence, on the other end, the echo interval T is given below $$T = \Delta t_{read} + \Delta te + 2 \cdot \Delta tr$$

Therefore, if one spin echo conventionally obtained in the high-speed spin echo sequence is converted to one in the field echo sequence, then reduction can be achieved by $\Delta te + \Delta t_{rf} + 2\cdot\Delta tr$ With N representing the number of spin echoes upon being converted from the high-speed echo sequence to the field echo sequence, the echo collection time is reduced by $(\Delta te + \Delta t_{rf} + 2\cdot\Delta tr)\cdot N$ Stated conversely, more echoes can be obtained by making a switching to the field echo sequence in the same echo collection time.

Figure 5A:
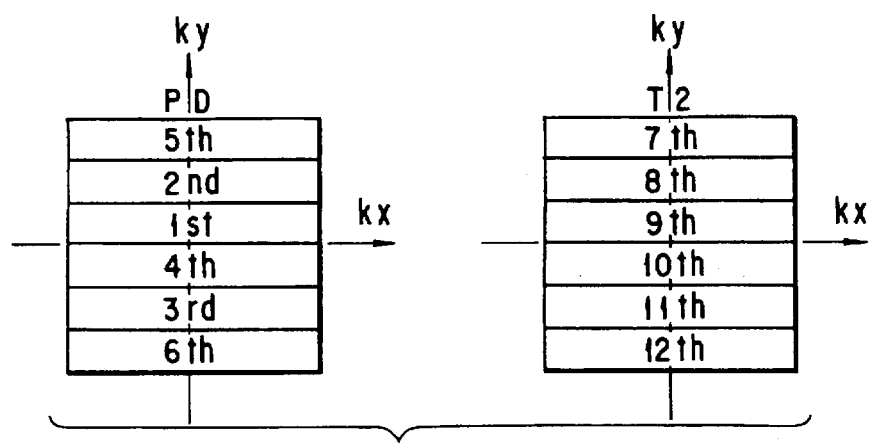
FIGS. 5A to 5C, each, show a method for allocating a plurality of echoes obtained in a pulse sequence of FIG. 4 to two kinds of images in a double contrast mode.
Figure 5B:
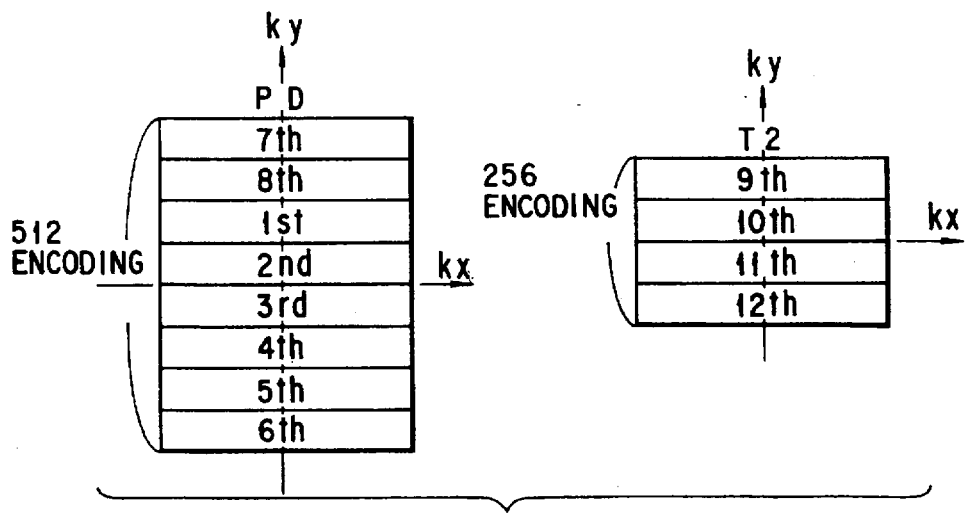
Figure 5C:
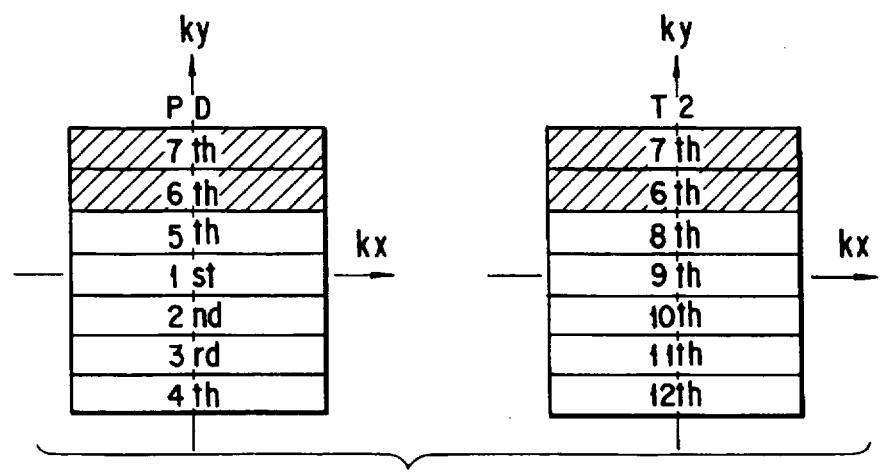

From the spin echo thus obtained, first and second images are constructed with the use of a computer system, noting that the first image corresponds to, for example, a spin density image and that the second image corresponds to, for example, a $T_2$-enhanced image. How the spin echoes obtained in the pulse sequence of FIG. 4 should be allocated to the first and second images is variously considered. FIGS. 5A to 5C show the way how the spin echoes obtained in the pulse sequence of FIG. 4 should be allocated to the first and second images. For the case shown in FIG. 5, the first image is constructed from the first to sixth spin echoes obtained in the field echo sequence while, on the other hand, the second image is constructed from the seventh to twelfth spin echoes obtained in the high-speed echo sequence. For the case shown in FIG. 5B, the first image is constructed from the first to sixth spin echoes obtained in the field echo sequence and some spin echo (seventh and eighth echoes) obtained in the high-speed spin echo sequence and the second image is constructed from remaining spin echoes (ninth to twelfth echoes) obtained in the high-speed spin echo sequence. For the case shown in FIG. 5C, the first image is constructed from the first to sixth spin echoes obtained in the field echo sequence and some spin echo obtained in the high-speed spin echo sequence and the second image is constructed from some spin echo (sixth echo) obtained in the field echo sequence and seventh to twelfth spin echoes obtained in the high-speed spin echo sequence.

Here, suppressing the degradation of images from the standpoint of an image construction will be explained below.

(1) In the field echo sequence, dephasing occurs each time the read gradient magnetic field is polarity inverted. In accordance with the polarity inversion of the read gradient magnetic field, the dephasing arises due to the variation of its amplitude. The extent of the amplitude variation obviously differs depending upon whether the read gradient magnetic field involves a positive polarity or a negative polarity. Now consideration will be given about, for example, the first to sixth spin echoes obtained in the field echo sequence of FIG. 4. That is, the first, third, fourth and sixth spin echoes contain those dephasing components of the same extent and the second and fifth spin echoes contain those dephasing components of the same extent. The first, third, fourth and sixth spin echoes are different in their dephasing extent from the second and fifth spin echoes. Needless to say, the dephasing degrades an image quality due to its deformation and, likewise, the dephasing extent also causes the degradation of an image quality because oscillation occurs along a phase-encoding axis. The dephasing per se cannot be eliminated so long as the field echo method is used. However, it may be considered that, in order to avoid the latter cause, phase-encoding is effected on the positive or negative side of the phase-encoding axis in the Fourier's space to allocate the corresponding polarity of the read gradient magnetic field, that is, the data of the corresponding dephasing extent, to the positive or negative side of the phase-encoding axis so that the dephasing level is suppressed.

(2) The phase-encoding is effected to allow the data items which are necessary to compose a single image to be allocated to the positive and negative sides, in equal numbers, along the phase-encoding axis (Ky).

(3) The degradation of an image quality is caused due to the associated signal intensity abruptly varied along the phase-encoding axis in a Fourier space. Since the signal strength is varied with a function of a lapsing time from an excitation pulse, the intensity variation is unavoidable. In order to suppress the abrupt variation of the signal strength and hence to allow it to be smoothly varied along the phase-encoding axis, the phase-encoding is performed, thus alleviating such a degradation in image quality.

Figure 7A:
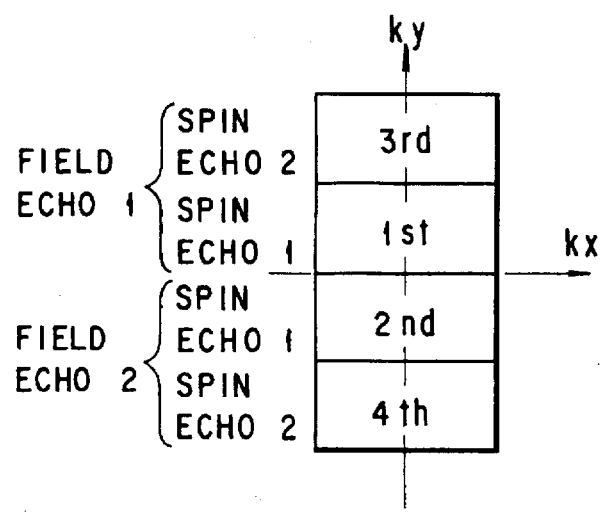
FIGS. 7A to 7C are an explanatory view for effectively obtaining two echoes each time a 180° pulse is applied with a field echo method.
Figure 7B:
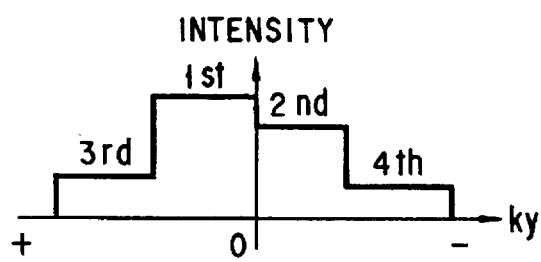
Figure 7C:
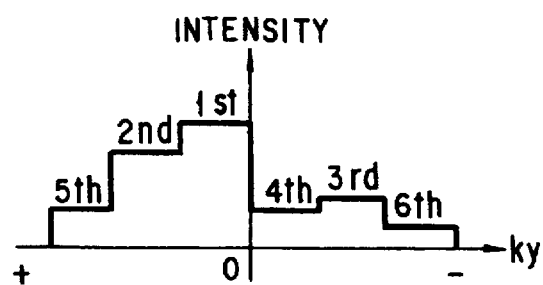

FIG. 7C shows a variation in the intensity of a signal along the phase-encoding axis (here, Ky) for the case of the first image obtained from the allocation method as shown in FIG. 6A and from this it will be appreciated that it is not possible to achieve such tasks (1) and (3) as set out above.

Here, in order to achieve all the tasks (1), (2) and (3) as set out above, the pulse sequence of FIG. 4, especially the field echo sequence, is modified as will be set out below. In the field echo sequence, the read gradient magnetic field is polarity-inverted only once, subsequent to the respective inverted pulse, and those corresponding spin echoes are detected in units of two, that is, the first to fourth spin echoes are obtained, in units of two, each time on excitation pulse is applied. At this time, the phase-encoding is so varied that the first to fourth spin echo data items are arranged in a sequence of the third, first, second and fourth spin echoes from the positive side to the negative side with the first and third spin echoes of equally dephasing extent on the same polarity side (here, the positive polarity side) and second and fourth spin echoes of equally dephasing extent on the same polarity side (here, the negative polarity side) as shown in FIGS. 7A and 7B. By varying the field echo sequence in this way, all the tasks can be achieved, thus suppressing the degradation of an image quality obtained.

The present invention is not restricted to the above-mentioned embodiment only and various changes or modifications of the present invention can be made without departing from the spirit and scope of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic-resonance imaging apparatus comprising:
   first generating means for generating an excitation pulse;
   second generating means for periodically generating a plurality of inversion pulses after the excitation pulse;
   third generating means for generating a gradient magnetic field whose polarity alternates in each of some of intervals between pairs of inversion pulses;
   first detecting means for detecting a plurality of echoes in each of the some of intervals;
   second detecting means for detecting an echo in each of the others of the intervals; and
   means for reconstructing a first image and a second image based on the detected echoes.

2. A magnetic-resonance imaging apparatus according to claim 1, in which, said third generating means generates three alternate polarity gradient magnetic pulses to detect three echoes.

3. A magnetic-resonance imaging apparatus according to claim 1, in which, said third generating means generates two alternate polarity gradient magnetic pulses to detect two echoes.

4. A magnetic-resonance imaging apparatus according to claim 3, in which said first detecting means sequentially detects first through fourth echoes in continuous two intervals, and wherein the first and third spin echoes are detected on one of positive and negative polarity sides along a phase-encoding axis, and the second and fourth spin echoes are detected on the other polarity side along the phase-encoding axis.

5. A magnetic-resonance imaging apparatus according to claim 4, in which the control means enables the third spin echo, first spin echo, second spin echo and fourth spin echo to be arranged in that sequence along the phase-encoding axis.

6. A magnetic-resonance imaging apparatus according to claim 1, in which the first image corresponds to a spin density image and the second image corresponds to a $T_2$-enhanced image.

7. A magnetic-resonance imaging apparatus according to claim 6, in which said image reconstructing means reconstructs the spin density image from echoes detected by said first detecting means, and reconstructs the $T_2$-enhanced image from echoes detected by said second detecting means.

8. A magnetic-resonance imaging apparatus according to claim 6, in which said image reconstructing means reconstructs the spin density image from echoes detected by said first detecting means and some of echoes detected by said second detecting means, and reconstructs $T_2$-enhanced image from the others of echoes detected by said second detecting means.

9. A magnetic-resonance imaging apparatus according to claim 6, in which the image reconstructing means reconstructs the spin density image from echoes detected by said first detected means and some of echoes detected by said second detecting means, and $T_2$-enhanced image from some of echo detected by said first detecting means and echoes detected by said second detecting means.

10. A method of operating a magnetic resonance imaging apparatus, comprising:

performing the following steps in a single sequence:
  a) applying an excitation pulse;
  b) applying a plurality of inverting pulses after said excitation pulse, each inverting pulse applied in an interval of time;
  c) detecting a first plurality of first echo signals from a first plurality of intervals of time, with a second plurality of first echo signals, less than said first plurality of first echo signals, detected within one of said first plurality of intervals of time;
  d) detecting a plurality of second echo signals from a second plurality of intervals of time, with a second echo signal detected in each of said second plurality of intervals of time; and
  e) reconstructing a first and a second image based upon said first plurality of first echo signals and said first plurality of second echo signals.

* * * * *